US006833958B2

(12) United States Patent
Rankin et al.

(10) Patent No.: US 6,833,958 B2
(45) Date of Patent: Dec. 21, 2004

(54) OPTICAL CAVITIES FOR OPTICAL DEVICES

(75) Inventors: Glenn H. Rankin, Menlo Park, CA (US); Jeffrey N. Miller, Los Altos Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/778,661

(22) Filed: Feb. 6, 2001

(65) Prior Publication Data

US 2002/0135909 A1 Sep. 26, 2002

(51) Int. Cl.$^7$ .................................................. G02B 1/10
(52) U.S. Cl. ........................ 359/580; 359/260; 257/98
(58) Field of Search ................................ 359/580, 577, 359/578, 260, 291, 587, 589; 372/46, 96, 101, 102, 99, 45, 20; 257/98

(56) References Cited

U.S. PATENT DOCUMENTS

| | | | | |
|---|---|---|---|---|
| 4,815,084 A | * | 3/1989 | Scifres et al. .................. | 372/46 |
| 5,151,917 A | * | 9/1992 | Perillous et al. ............ | 372/102 |
| 5,291,502 A | | 3/1994 | Pezeshki et al. .............. | 372/20 |
| 5,349,603 A | * | 9/1994 | Kaneda et al. ............... | 372/101 |
| 5,428,634 A | * | 6/1995 | Bryan et al. .................. | 372/45 |
| 5,629,951 A | | 5/1997 | Chang-Hasnain et al. ..... | 372/20 |
| 5,633,527 A | * | 5/1997 | Lear ............................ | 257/432 |
| 5,666,225 A | * | 9/1997 | Colbourne ................... | 359/589 |
| 5,739,945 A | | 4/1998 | Tayebati ...................... | 359/291 |
| 5,786,915 A | * | 7/1998 | Scobey ........................ | 359/589 |
| 6,438,149 B1 | * | 8/2002 | Tayebati et al. ............... | 372/45 |

FOREIGN PATENT DOCUMENTS

| | | |
|---|---|---|
| WO | WO 99/34484 | 8/1999 |
| WO | WO 99/50940 | 10/1999 |
| WO | WO 99/52647 | 10/1999 |

OTHER PUBLICATIONS

Leger, J. R. et al., "Micro–Optics in VCSEL and Solid–State Laser Resonators", Proceedings of the SPIE, vol. 3267, 1998, pp. 107–115.

Koch, B.J. et al., "Single–Mode Vertical Cavity Surface Emitting Laser by Graded–Index Lens Spatial Filtering", Applied Physics Letters, American Institute of Physics, vol. 70, No. 18, May 5, 1997, pp. 2359–2361.

Jing, et al., "The threshold current density of InGaAsP/InP surface emitting laser diodes with hemispherical resonator;" *Laser Diode Technology and Applications III*, 1991; pp. 434–441.

Tayebati, et al., "Widely turnable Fabry–Perot filter using Ga(AI)As/AIOx deformable mirrors;" *OFC 1998 Technical Digest*, 1998; pp. 9–10.

Vakhshoori, et al., "2mW CW singlemode operation of a tunable 1550 nm vertical cavity surface emitting laser with 50 nm tuning range;" *Electronics Letters*, May 27, 1999; pp. 900–901.

(List continued on next page.)

*Primary Examiner*—Mark A. Robinson
*Assistant Examiner*—Alessandro Amari (57) ABSTRACT

The present disclosure relates to an optical cavity, comprising a first non-concave reflector positioned at a first end of the optical cavity and a second non-concave reflector positioned at a second end of the optical cavity that receives and reflects light reflected from the first non-concave reflector. The first non-concave reflector is configured to focus light that reflects off of the reflector back upon itself to avoid diffraction losses from the optical cavity. In one embodiment of the invention, the first non-concave reflector includes a layer of material that has a thickness that vanes as a function of radial distance out from an axial center of the layer. In another embodiment of the invention, the first non-concave reflector includes a layer of material that has an index of refraction that varies as a function of radial distance out from an axial center of the layer.

6 Claims, 11 Drawing Sheets

OTHER PUBLICATIONS

Tayebati, et al., "Microelectromechanical tuneable filters with 0.47 nm linewidth and 70 nm tuning range;" *Electronics Letters*, Jan. 8, 1998; pp. 76–77.

Tayeloati, et al., "Microelectromechanical tunable filter with stable half symmetric cavity;" *Electronics Letters*, Oct. 1, 1998; pp. 1967–1968.

Tayebati, et al., "Half–Symmetric Cavity Tunable Microelectromechanical VCSEL with Single Spatial Mode;" Dec., 1998; pp. 1679–1681.

Kogelnick, et al., "Laser Beams and Resonators;" *Applied Optics*, Oct., 1966; pp. 1550–1566.

Checcacci, et al., "Modes, Phase Shifts, and Losses of Flat–Roof Open Resonators;" *Applied Optics*, Oct. 1966; p. 1567.

Ho, et al., "Novel Hemispherical Vertical Cavity 1–3$\mu$m Surface–Emitting Laser on Semi–Insulating Substrate;" *Electronics Letters*, Oct. 12, 1989; pp. 1427–1428.

Coldren, et al., "Dielectric apertures as intracavity lenses in vertical–cavity lasers;" *Appl. Phys. Letters*, Jan. 15, 1996.

* cited by examiner

OPTICAL CAVITIES FOR OPTICAL DEVICES

FIELD OF THE INVENTION

The present disclosure relates to optical cavities for optical devices. More particularly, the disclosure relates to optical cavities for semiconductor and/or dielectric optical devices incorporating a focusing reflector.

BACKGROUND OF THE INVENTION

Semiconductor fabrication techniques have enabled the construction of miniaturized optical devices. Two examples of such devices are semiconductor lasers, e.g., vertical cavity surface emitting lasers (VCSELs), and semiconductor optical filters. Through these techniques, optical devices can be constructed having dimensions on the order of only a few microns. Applications for such devices are many and include optical communications as well as the construction of optical circuits.

Semiconductor lasers and filters comprise optical cavities through which light passes before being emitted from the devices. Such optical cavities normally include highly reflective, flat mirrors positioned at opposed ends of the cavities that reflect light back and forth within the cavity. The cavities often include an air gap positioned between the mirrors and, in the case of semiconductor lasers, a gain medium that increases the intensity of the light.

In early designs, semiconductor lasers and filters were only capable of emitting fixed frequencies of optical radiation. More recent semiconductor lasers and filters have been constructed with displaceable mirrors to provide for frequency tuning. Displacement of a mirror at an end of an optical cavity changes the relative spacing of the mirrors and therefore the length of the cavity. As is known in the art, adjustment of the cavity length alters the frequency at which the laser or filter emits radiation.

Optical cavities formed with flat mirrors present significant disadvantages. For instance, flat mirror optical cavities are highly susceptible to losses due to misalignment of the mirrors. This misalignment can be magnified when one or both of the mirrors is displaced during tuning. In addition, even where the mirrors are aligned correctly, diffraction losses can occur. To reduce such losses, recent semiconductor lasers and filters have been constructed with a concave, semispherical mirror at one end of the optical cavity. With such a configuration, light is reflected back on itself within the device cavity to prevent the light from escaping.

Figure 1:
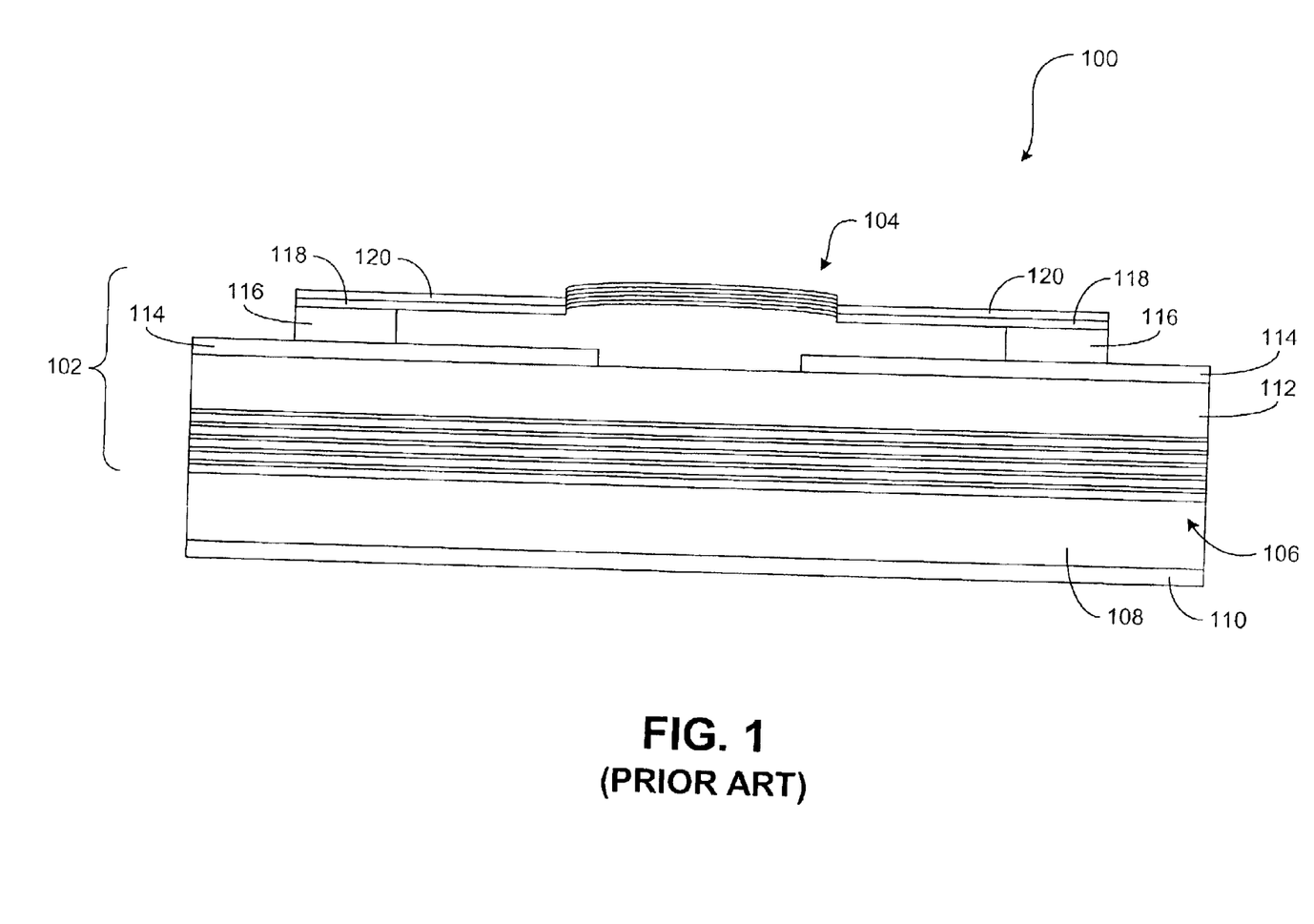
FIG. 1 is a schematic of a prior art semiconductor laser.
Figure 2:
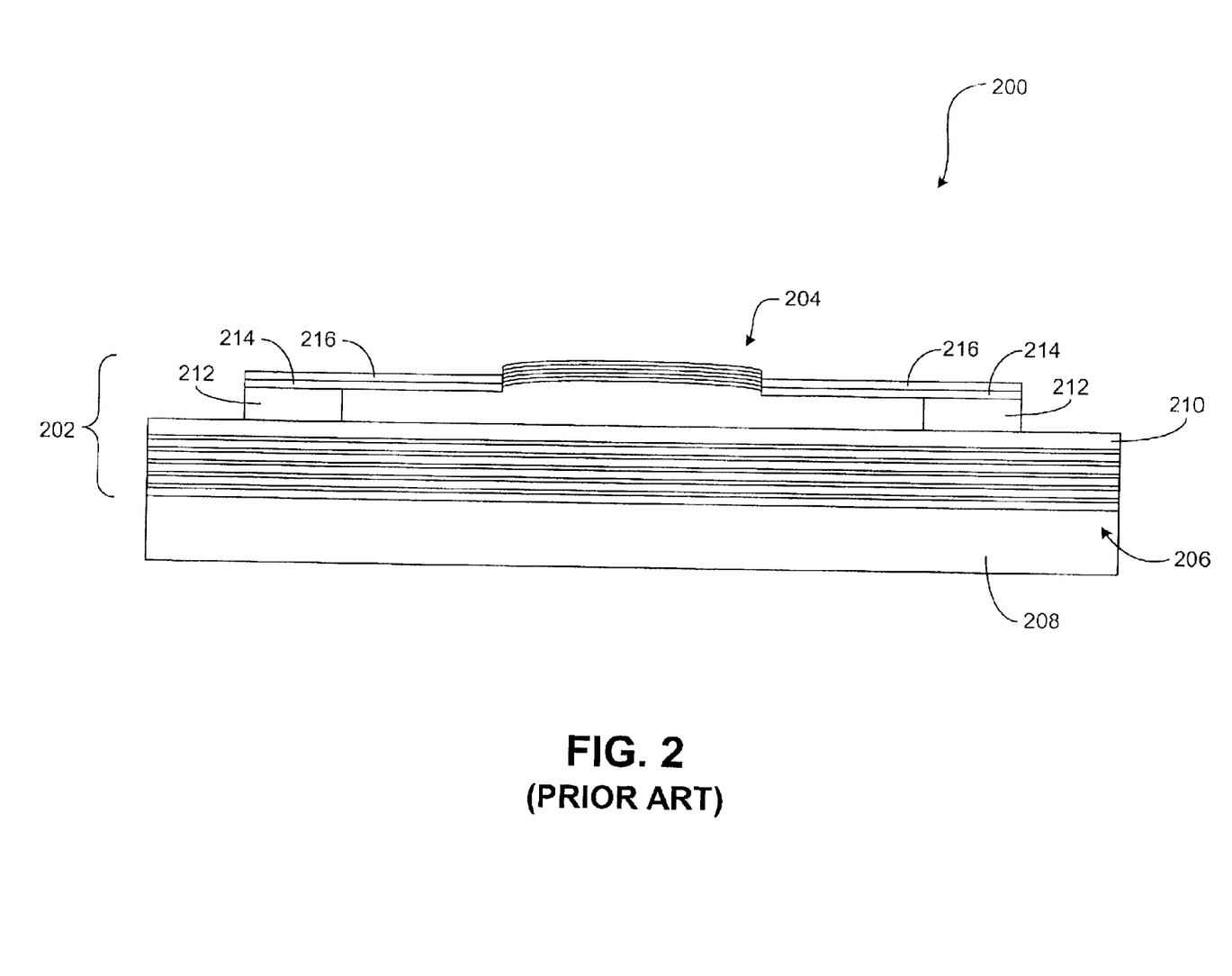
FIG. 2 is a schematic of a prior art semiconductor filter.

FIGS. 1 and 2 illustrate an example prior art semiconductor laser 100 and filter 200, respectively. As indicated in FIG. 1, the semiconductor laser 100 comprises an optical cavity 102. At one end of the cavity 102 is a first mirror 104 and at the other end of the cavity is a second mirror 106. Below the second mirror 106 is a substrate 108 constructed of a semiconductor material. Formed on the substrate 108 is a first current injection layer 110 that is used to provide current to the laser 100 during operation. Disposed within the optical cavity 102 is an active region 112 that is responsible for generating the light that is emitted out of the laser 100. In contact with the active region 112 is a second current injection layer 114 that, like the first current injection layer 110, is used to provide current to the laser 100. Formed on top of the second current injection layer 114 are support posts 116 that, together with support tethers 118, suspend the first mirror 104 above the active region 112. Normally formed on the support tethers 118 are tuning electrodes 120 that are used to deliver voltage to the first mirror 104 that displaces it when the laser 100 is tuned. As is evident from FIG. 1, the first mirror 104 is arranged in a concave, semispherical orientation such that light incident on the first mirror is focused inwardly on itself to prevent diffraction losses.

FIG. 2 illustrates the semiconductor filter 200. As is apparent from this figure, the semiconductor filter 200 is similar in construction to the semiconductor laser 100 shown in FIG. 1. Accordingly, the filter 200 comprises an optical cavity 202 that is defined by a first mirror 204 and a second mirror 206. In addition, the semiconductor filter 200 includes a substrate 208, first tuning electrode 210, support posts 212, support tethers 214, and second tuning electrodes 216. Accordingly, the semiconductor filter 200 primarily differs from the semiconductor laser 100 of FIG. 1 in the omission of the active region 112.

Although capable of providing for reduced losses, optical cavities having a concave, semispherical mirror are difficult to manufacture. As is known in the art, it is difficult to form a precise concave surface on a very small scale (e.g., 10 μm in diameter) through present semiconductor fabrication techniques. Accordingly, it can be appreciated that it would be desirable to have a tunable, low-loss optical cavity for semiconductor lasers and filters that does not require a concave, semispherical mirror.

SUMMARY OF THE INVENTION

The present disclosure relates to an optical cavity, comprising a first non-concave reflector positioned at a first end of the optical cavity and a second non-concave reflector positioned at a second end of the optical cavity that receives and reflects light reflected from the first non-concave reflector. The first non-concave reflector is configured to focus light that reflects off of the reflector back upon itself to avoid diffraction losses from the optical cavity.

In one embodiment of the invention, the first non-concave reflector includes a layer of material that has a thickness that varies as a function of radial distance out from an axial center of the layer. By way of example, the outer layer can include a substantially convex, semispherical outer surface and a substantially planar inner surface.

In another embodiment of the invention, the first non-concave reflector includes a layer of material that has an index of refraction that varies as a function of radial distance out from an axial center of the layer.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 3:
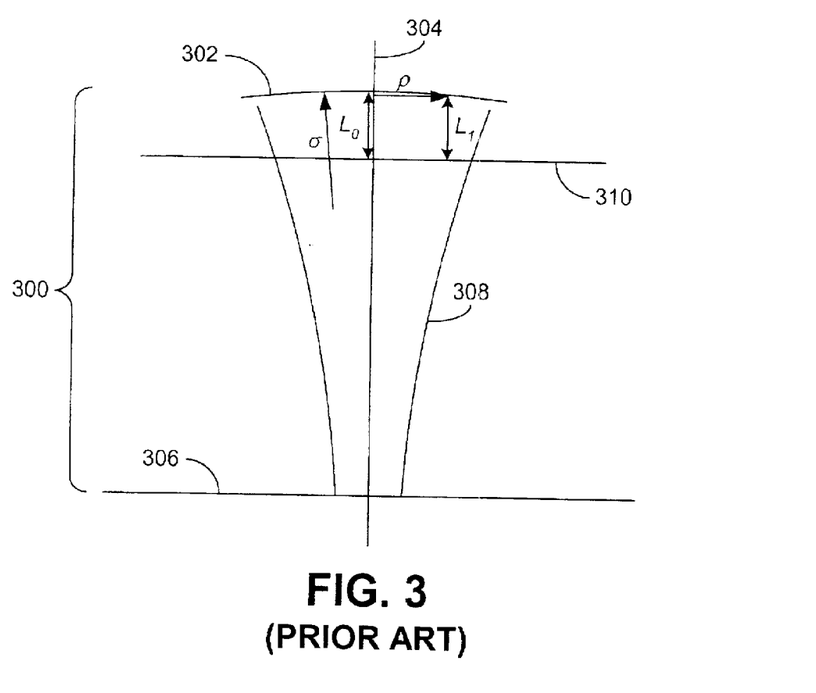
FIG. 3 is a schematic of a prior art optical cavity.

Referring now in more detail to the drawings, in which like numerals indicate corresponding parts throughout the several views, FIG. 3 provides a schematic representation of a prior art optical cavity 300 that incorporates a concave, semispherical mirror 302. As indicated in this figure, the mirror 302 is centered about an axis of symmetry 304 and faces a planar mirror 306 at the other end of the cavity 300. The concave, semispherical mirror 302 has a radius of curvature, σ. Distances outward from the axis of symmetry 304 to points on the surface of the concave, semispherical mirror 302 are represented by the distance, ρ.

As is known in the art, the arrangement shown in FIG. 3 provides a focusing effect such that a beam of light 308 can travel back and forth between the mirrors 302, 306 without a significant portion of the light being lost through diffraction. In particular, the provision of a concave, semispherical mirror 302 counteracts the natural tendency for a light beam to continuously expand as it travels. The optical cavity 300, the focusing power of the mirror 302, the separation of the mirrors 302 and 306, and the beam diameter can each be selected so that little light leaks out past the edges of the mirrors as the light travels back and forth within the cavity 300.

Figure 4:
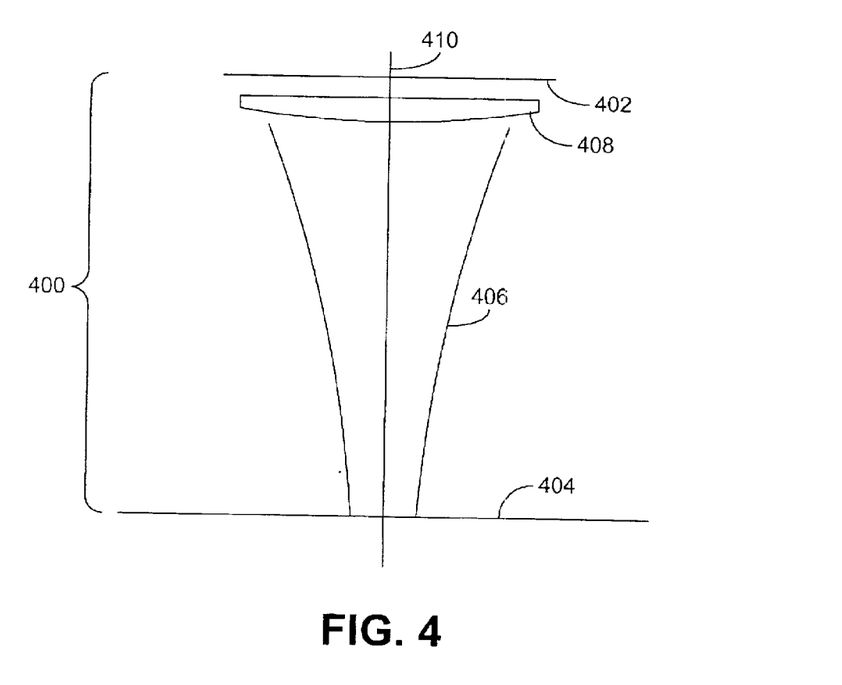
FIG. 4 is a schematic of an optical cavity incorporating a focusing lens.

Due to the difficulty associated with the construction of small scale concave mirrors identified above, alternative means for focusing light between two mirrors are needed. FIG. 4 illustrates one such alternative. As indicated in this figure, an optical cavity 400 can be constructed with first and second planar mirrors 402 and 404. To focus the light beam 406, a lens 408 (e.g., a ground and polished glass lens) can be positioned in the cavity 400 adjacent one of the mirrors (e.g., mirror 402). In such an arrangement, the lens 408 comprises a relatively flat, positive lens capable of focusing light back on itself.

Although theoretically possible to construct an optical cavity 400 as that shown in FIG. 4, it would be impractical to do so. First, the lens 408 must be produced with very high precision and would need to be supported within the cavity 400 in a very precise manner. Such precision requires fabrication and mechanical complexity that could render the design impractical for repeatable production. In addition, the lens 408 would most likely need an antireflection coating on both its top and bottom surfaces to reduce undesired reflections. Inclusion of such antireflection coatings would degrade the performance of the optical cavity 400 by increasing the length of the cavity. As is known in the art, the best performance is normally achieved when the length of the optical cavity is kept very small, for instance, on the order of several light wavelengths. Accordingly, it would be desirable to obtain the focusing effect provided by a lens without actually using a lens within the optical cavity.

Figure 5:
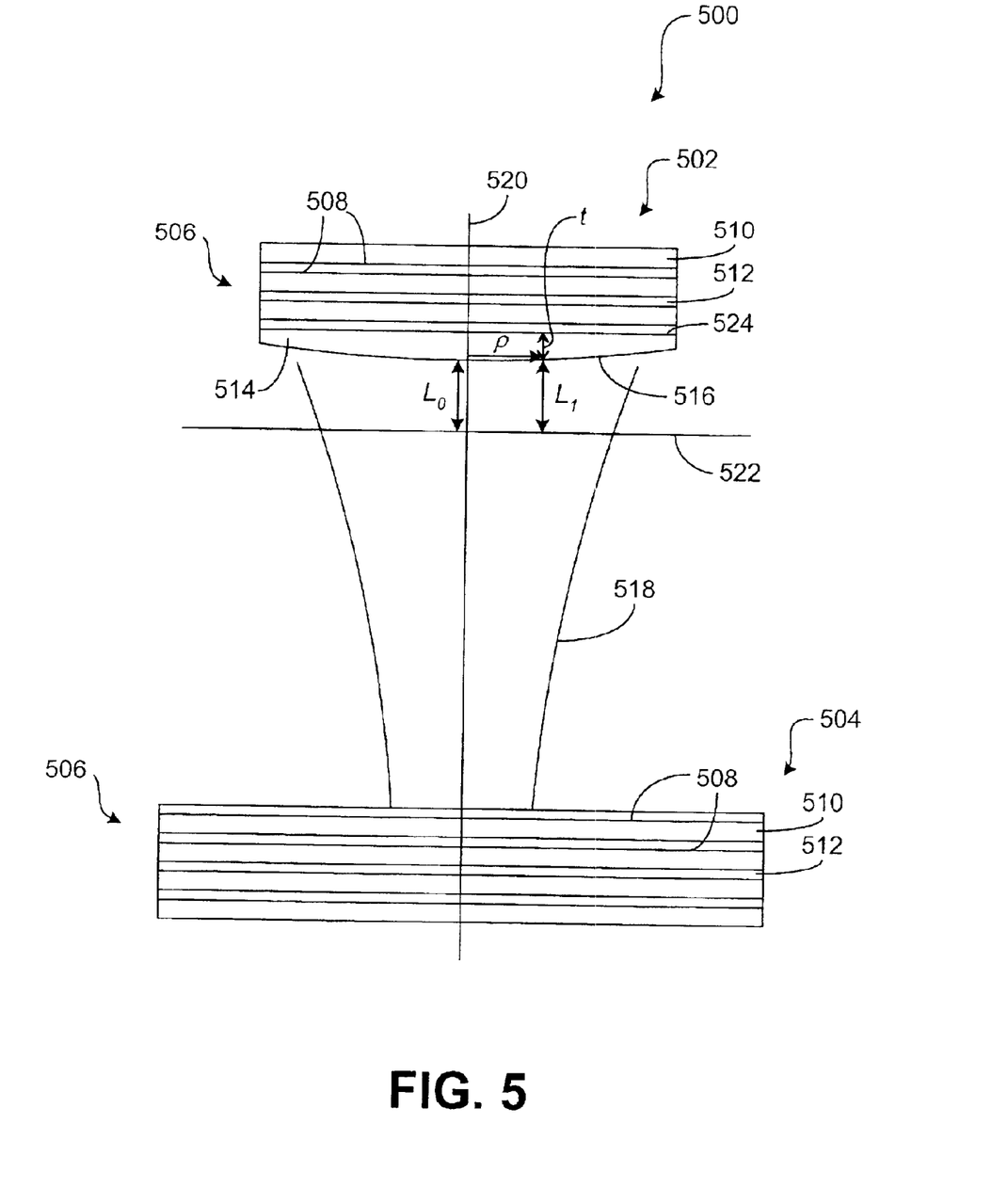
FIG. 5 is a schematic of a first optical cavity of the invention.

FIG. 5 illustrates a first optical cavity 500 of the invention. As is illustrated in this figure, the optical cavity 500 includes a first reflector 502 and a second reflector 504 that are positioned at opposite ends of the cavity. Each of the reflectors 502, 504 is normally constructed as a distributed Bragg reflector (DBR) comprising a plurality of semiconductor and/or dielectric layers 506 in a stacked configuration. Although the reflectors 502, 504 could alternatively be constructed of known metal materials, semiconductor and/or dielectric materials are preferred in that reflectors can be made with greater precision when constructed of these materials, especially where the scale of the reflectors is very small. Typically, each reflector 502, 504 comprises alternating semiconductor or dielectric materials having different indices of refraction. The difference in the refraction indices gives rise to partial reflection of light at each layer interface 508. Although the reflection from each interface 508 is relatively small, a total reflectivity of greater than 99% can be achieved with this alternating, stacked configuration. For maximum reflectivity, each layer 506 has a wave thickness equal to $\lambda/4n$ (i.e., quarter wave optical thickness) where $\lambda$ is the wavelength of the light and n is the refractive index of the material.

As is indicated in FIG. 5, the semiconductor or dielectric layers 506 can also alternate between relatively thick layers 510 and relatively thin layers 512. By way of example, the relatively thick layers 510 can comprise silicon dioxide ($SiO_2$) and the relatively thin layers can comprise titanium dioxide ($TiO_2$). Moreover, although the layers 506 are shown and described herein as being relatively thick and thin, each normally is near quarter wave optical thickness due to their differences in index of refraction. Although a specific number of layers 506 is shown for each of the reflectors 502, 504 it is to be understood that alternative configurations are feasible.

The first reflector 502 includes a convex outer layer 514 that comprises a convex, semispherical surface 516. Accordingly, the first reflector 502 can be designated a convex reflector. As will be appreciated by persons having ordinary skill in the art, the convex, semispherical shape of the surface 516 provides a focusing effect similar to that of the lens 408 shown in FIG. 4 and to that of the concave, semispherical mirror 302 shown in FIG. 3. In particular, the convex, semispherical shape introduces a reflection delay that is radially symmetric from the center of the reflector 502. This delay creates a focusing effect that reflects light 518 back on itself to reduce diffraction losses.

To achieve the desired focusing effect, the convex outer layer 514 can be constructed with a particular thickness, t, that varies as a function of a distance, ρ, from the axis of symmetry 520 of the first reflector 502. This thickness can be determined through normal experimentation by persons having ordinary skill in the art. Alternatively, this thickness can be estimated by analogy to existing optical cavities that use concave, semispherical mirrors. One concave arrangement that has been shown to be effective is that proposed by Vakhshoori, et al. in an article entitled "Microelectromechanical Tunable Filter with Stable Path Symmetric Cavity," which appeared in *Electronics Letters* on May 27, 1999. In this article, Vakhshoori, et al. describe a single mode, 1550 nanometer (nm), vertical cavity surface emitting laser (VCSEL) having a 50 nm tuning range. The VCSEL described in the article comprises a concave, semispherical mirror having a radius of curvature, σ, of 300 μm.

The thickness, t, of the convex outer layer 514 can be chosen to emulate a concave, semispherical mirror such as that of the Vakhshoori, et al. VCSEL. In particular, the thickness, t, of the layer 514 can be selected to provide a phase delay, Δϕ, representative of the delay in phase between two light rays $L_0$ and $L_1$ reflected off of the first reflector 502 and separated by a distance, ρ (see FIG. 5) that is equal to the phase delay, Δϕ, between two light rays $L_0$ and $L_1$ reflected off of the first mirror 302 and separated by the same distance, ρ (see FIG. 3). The phase delay, Δϕ, for the concave arrangement (i.e., FIG. 3) is given by $$\Delta\phi = -k\Delta L \qquad \text{[Equation 1]}$$

where k is the propagation constant equal to 2π/λ, ΔL is the difference in the lengths $L_0$ and $L_1$ traveled by a light ray along the axis of symmetry 304 and a light ray traveling parallel to the axis of symmetry but spaced therefrom a distance, ρ, to the reference plane 310, and λ is the wavelength of the light. The length difference, ΔL, is given by $$\Delta L = \rho^2/\sigma \qquad \text{[Equation 2]}$$

where σ is the radius of curvature of the concave, semispherical mirror 302. By substituting $\rho^2/\sigma$ into Equation 1, the phase delay, Δϕ, between the two rays can be defined as a function of σ

$$\Delta\phi = -k\rho^2/\sigma \qquad \text{[Equation 3]}$$

For purposes of example, a wavelength of λ=1.5 μm and a distance ρ=6 μm from the axis of symmetry 304 can be assumed to determine the phase delay, Δϕ, between the two rays at a distance of ρ=6 μm. By inserting these parameters into Equation 3, the phase delay, Δϕ, at this distance is equal to −0.16 π.

As identified above, the thickness, t, of the convex outer layer 514 can be constructed to emulate this phase delay, Δϕ, to obtain the same focusing effect of the concave arrangement of FIG. 3. This can be accomplished by first calculating the phase, ϕ, of a light ray that travels parallel to the axis of symmetry 520 through a given thickness, t, of semiconductor or dielectric material. Although light is reflected multiple times at each layer interface 508, the details for the planar layers 506 of the first reflector 502 need not be considered if it is assumed that the stack comprising these layers is thick enough to reflect nearly all the light. In that case, the total effect of the stack can be approximated by $R_{planar\ stack} = |r_{planar\ stack}|^2 = 1$, where $R_{planar\ stack}$ is the optical power reflectivity of the light beam and $r_{planar\ stack}$ is the optical field reflectivity of the light beam. The reflectivity of the composite structure comprising the planar stack and the convex outer layer 514, $r_{comp}$, is given by $$r_{comp} = (r + e^{-i\phi})/(1 + re^{-i\phi}) \qquad \text{[Equation 4]}$$

By inserting an r value that closely approximates the optical field reflectivity at the convex, semispherical surface/air interface, $r_{comp}$ can be calculated. If the outer layer 514 is assumed to be constructed of $SiO_2$, r=−0.18.

The phase, ϕ, for a light beam traveling down and back from the convex, semispherical surface 516 to a planar surface 524 of the outer layer 514 is $$\phi = k(2t) \qquad \text{[Equation 5]}$$

where t is the thickness of the layer 514 at the distance, ρ, outward from the axis of symmetry 520. The constant, k, is given by $$k = 2\pi n/\lambda \qquad \text{[Equation 6]}$$

where n is the refractive index of the material used to construct the convex outer layer 514 and λ is the free space wavelength of the light. In Equation 4, the phase of $r_{comp}$ is that of the composite reflector 502 comprising the convex outer layer 514 and the planar layers 506. More useful, however, is the phase of the reflected light at the reference plane 522 (see FIG. 5) in that the degree to which the light is being focused can be more easily seen at this plane. To determine this, the quantity ((4πt/λ)−π/n) is added to the phase of $r_{comp}$ to account for the difference between the phase at the convex, semispherical surface 516 and at the reference plane 522.

Figure 6:
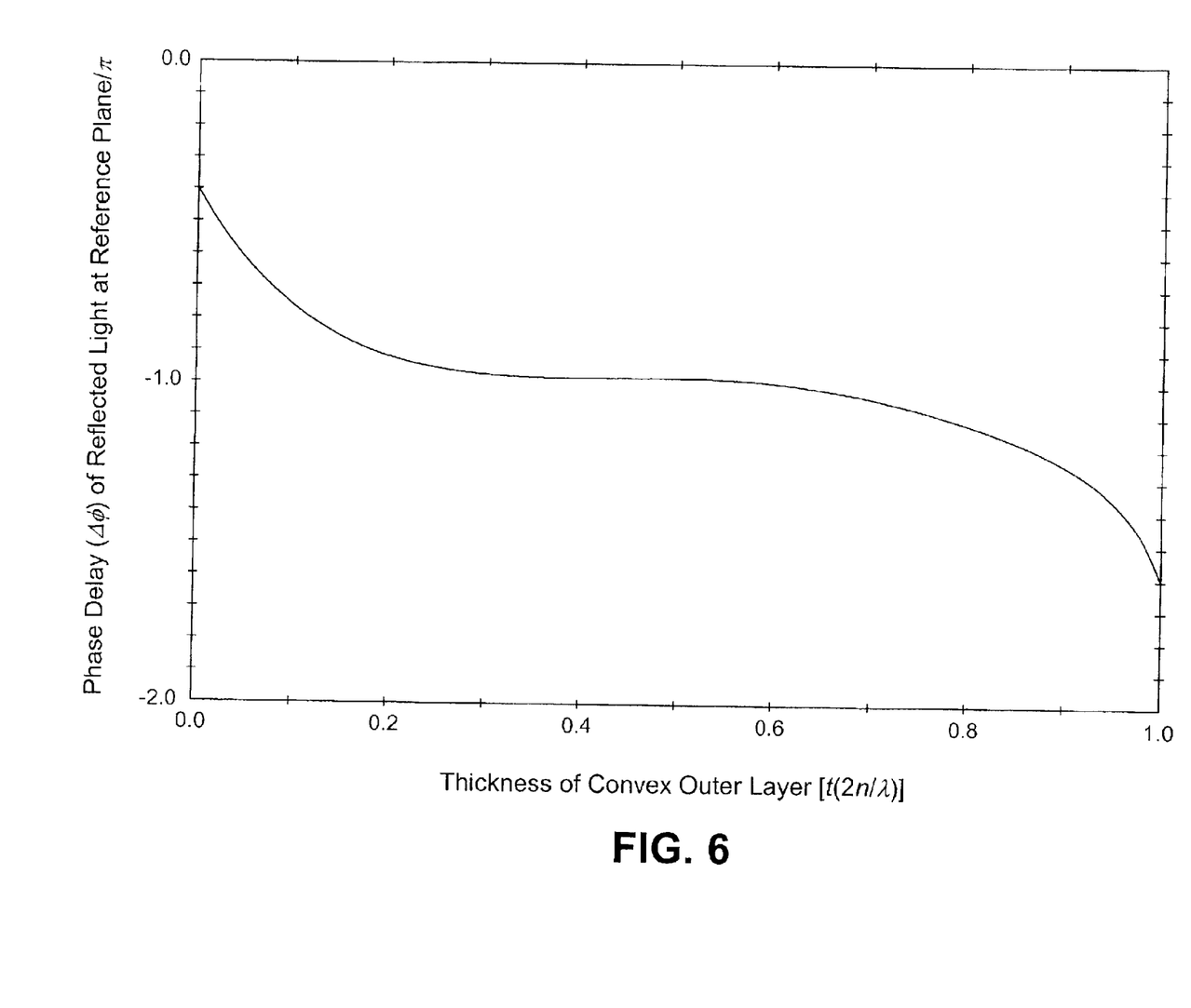
FIG. 6 is a graph plotting phase delay versus outer layer thickness.

FIG. 6 provides a graph of the phase delay, Δϕ, of the light reflected at the reference plane 522 versus the layer thickness, t, using Equations 5 and 6. Specifically, the graph of FIG. 6 plots ((4t/λ)−1/n))+Arg($r_{comp}(\phi(t))$)/π versus the rescaled thickness, t(2n/λ), where Arg($r_{comp}$)=Arctan(Im ($r_{comp}$)/Re($r_{comp}$))). The quantity t(2n/λ) is used to permit reference to a single graph irrespective of refractive index, n, and wavelength, λ. If n and λ are known, the graph can be used to relate phase delay, Δϕ, to the thickness, t, of the convex outer layer 514. For example, the thickness at a distance ρ=6 μm away from the axis of symmetry 520 can be determined. For maximum reflectivity, the thickness at the center of the convex outer layer 514 can be the quarter wave optical thickness, namely $$t = 0.25\lambda/n \qquad \text{[Equation 7]}$$

As identified above, a phase delay, Δϕ, of −0.16 results with the concave arrangement shown in FIG. 3 at a distance ρ=6 μm from the axis of symmetry 304. With reference to the graph of FIG. 6, this phase delay pertains to a thickness value (i.e., t(2n/λ)) of 0.14. By solving for t, the thickness can be determined to be 0.07λ/n. Therefore, the thickness, t, at a distance from the axis of symmetry of ρ=6 μm is 0.07 λ/n. The thickness, t, of the outer layer 514 can be determined in this manner for any distance, ρ, through relation of the phase delay, Δϕ, with thickness. It is to be noted that FIG. 6 is quantitative in nature and was generated assuming a variable thickness outer layer 514 that terminated a quarter wave layered stack. Persons having ordinary skill will appreciate that the thickness, t, of the convex outer layer 514 can alternatively be derived as a function of the distance, ρ, through conventional mathematics.

Figure 7:
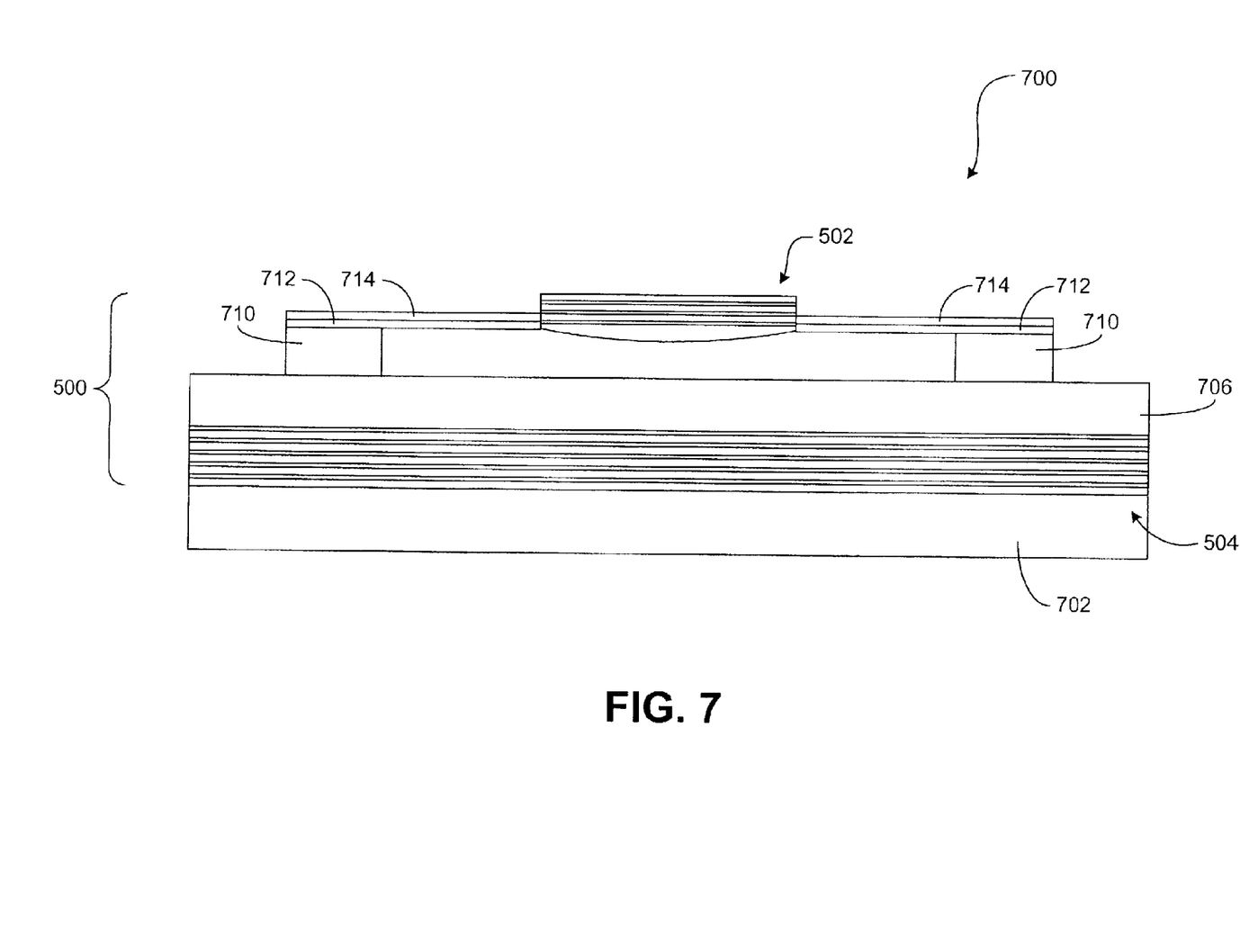
FIG. 7 is a schematic of a laser that incorporates the optical cavity shown in FIG.

FIG. 7 illustrates an example laser 700 incorporating the optical cavity 500 shown in FIG. 5. This laser is shown and described herein to provide an example application of the inventive optical cavity 500. Therefore, it is to be understood that the laser could have alternative construction, if desired. As shown FIG. 7, the laser 700 includes a substrate 702. By way of example, the substrate 702 can comprise an n-type doped semiconductor material. Where the laser 700 is a photo-pumped laser, the substrate 702 is adapted to receive light from a separate light source (not shown).

Disposed within the optical cavity 500 is an active region 706 where electrons and holes are recombined to produce laser light. This region 706 can include a plurality of quantum wells (not shown). By way of example, the active region 706 can comprise an intrinsic (i.e., undoped or lightly doped) semiconductor layer. Formed on top of the active region 706 are support posts 710 that are used to suspend the first reflector 502 above the active region 706. Although posts 710 are shown, it will be understood that alternative support means could be provided, if desired. By way of example, the support posts 710 can be formed of a dielectric material such as a polymeric material. Mounted on the support posts 710 are support tethers 712 that directly support the first reflector 502. As with the support posts 710, it will be understood that alternative support means could be used to suspend the first reflector 502. Formed on the support tethers 712 are tuning electrodes 714 that are used to deliver voltage to the first reflector 502. When voltage is applied to the tuning electrodes 714, the first reflector 502 is displaced downwardly toward the second reflector 504 to adjust (i.e., reduce) the length of the optical cavity 500 to change the frequency of emission of the laser 700.

In use, light is delivered to the laser 700, for example, through the substrate 702. This light reflects back and forth off of the first and second reflectors 502 and 504 until its intensity increases to the point at which light is transmitted through one of the reflectors, normally the first reflector 502. To adjust the frequency of this light, voltage can be provided to the first reflector 502 to cause it to be displaced in the manner described above.

Figure 8:
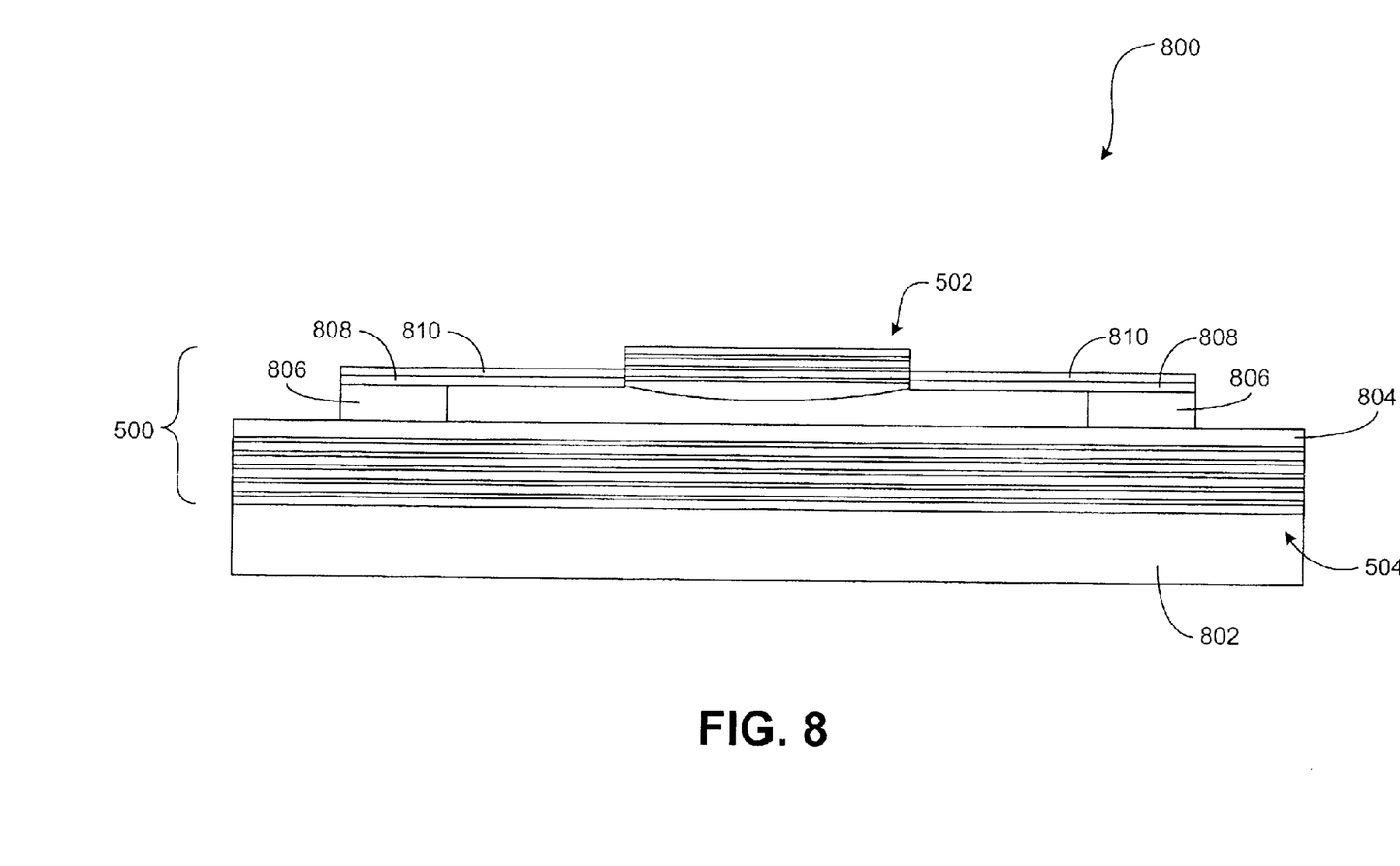
FIG. 8 is a schematic of a filter that incorporates the optical cavity shown in FIG.

FIG. 8 illustrates an example filter 800 that incorporates the optical cavity 500 shown in FIG. 5. As with the laser 700 shown in FIG. 7, this filter 800 is shown and described as an example application of the optical cavity 500. Therefore, it is to be appreciated that alternative constructions are feasible. As is apparent from FIG. 8, the filter 800 is similar in design to the laser 700. Accordingly, the filter 800 can include a substrate 802, a first tuning electrode 804, support posts 806, support tethers 808, and second tuning electrodes 810. In that the filter 800 is used to filter light as opposed to generate light, the filter 800 does not include a gain medium such as active region 706.

In use, light is provided to the filter 800 through either its top or bottom such that the light reaches the optical cavity 500. Within the cavity 500, the light travels back and forth between the reflectors 502, 504 and ultimately is transmitted through one of the reflectors 502, 504 (the reflector opposite to that through which the light entered the filter 800) at a desired optical frequency. The frequency of light that is emitted from the filter 800 is controlled by adjusting the displacement of the first reflector 502 by provided an appropriate voltage to the reflector with the tuning electrodes 804, 810.

Figure 9:
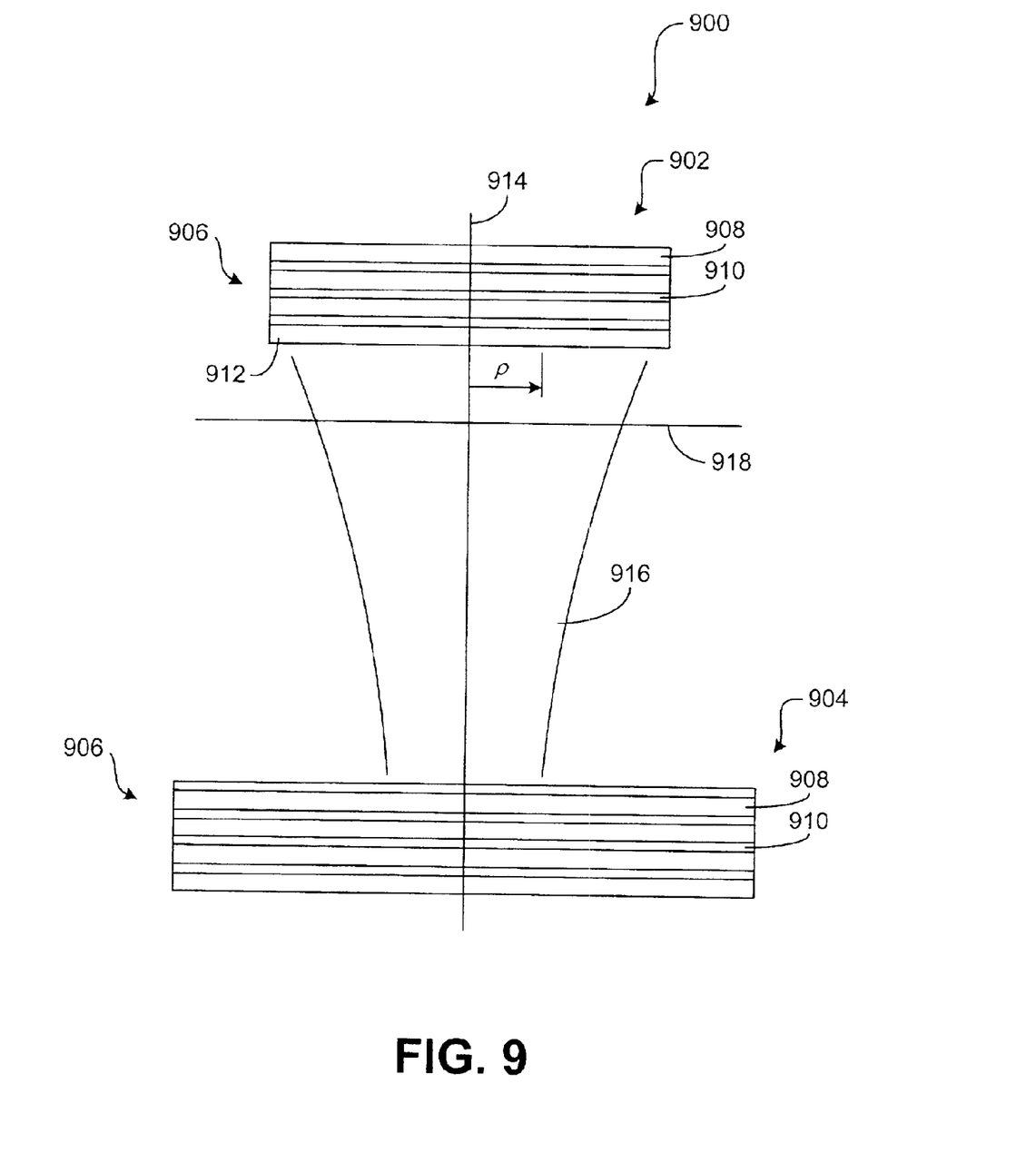
FIG. 9 is a schematic of a second optical cavity of the invention.

FIG. 9 illustrates a second optical cavity 900 of the invention. This optical cavity 900 is similar in many ways to the first optical cavity 500 shown in FIG. 5. Accordingly, the optical cavity 900 includes a first reflector 902 and a second reflector 904 that are positioned at opposite ends of the cavity. Furthermore, each of the reflectors 902, 904 is normally constructed as a DBR comprising a plurality of semi-conductor and/or dielectric layers 906 having quarter wave optical thicknesses and different indices of refraction.

As is with the optical cavity 500 of FIG. 5, the reflector layers 906 of the second optical cavity 900 can alternate between relatively thick layers 908 and relatively thin layers 910. By way of example, the relatively thick layers 908 can comprise silicon carbide (SiCx) or $SiO_2$ and the thin layers can comprise $TiO_2$. However, instead of having a convex, semispherical outer layer, the first reflector 902 of the second optical cavity 900 comprises a planar outer layer 912 having an index of refraction that varies radially outward from the central axis 914 of the reflector. More particularly, the index of refraction of the outer layer 912 is largest at its axial center and decreases outwardly therefrom. As will be appreciated by persons having ordinary skill in the art, this varied index of refraction provides a focusing effect on light 916 reflected back and forth between the reflectors 902, 904. This focusing effect occurs because, due to the difference in index of refraction, the optical distance traveled through the outer layer 912 by a light ray along the axis of symmetry 914 is longer than that traveled by a parallel light ray separated a distance, ρ, from this axis.

To achieve the desired focusing effect, the planar outer layer 912 is constructed to have a refractive index, n, that varies as a function of the distance, p, from the axis of symmetry 914. This refractive index can be determined through normal experimentation by persons having ordinary skill in the art. In addition, this refractive index can be estimated in similar manner to that described above with regard to the first optical cavity 500 by analogy to an optical cavity having a concave, semispherical mirror. By way of example, the refractive index, n, of the outer layer 912 can be chosen to emulate a convex, semispherical mirror having a radius of curvature, σ, of 300 μm (see FIG. 3). Again, the focusing effect can be quantified by evaluating the optical phase, φ, along paths parallel to the axis of symmetry 914. The phase, φ, of light passing through the outer layer 912 along any one path is given by φ=−2kl, where k is the propagation constant of the material at that point and l is the thickness of the material. In this calculation, k=(2πn)/λ, where n is the local index of refraction of the material and λ is the free space wavelength of light. The field reflectivity, r, is given by $$\frac{r_l + \exp[-i2k \cdot l]}{1 + r_l + \exp[-i2k \cdot l]} \quad \text{[Equation 8]}$$

where $r_l$ is the reflectivity of the interface between the outer layer 912 and the free space, and r is the reflectivity of the first reflector 902 as a whole. The phase of light reflected from the structure is given by $$\phi = a\tan\left[\frac{\operatorname{Im}[r]}{\operatorname{Re}[r]}\right] \quad \text{[Equation 9]}$$

Figure 10:
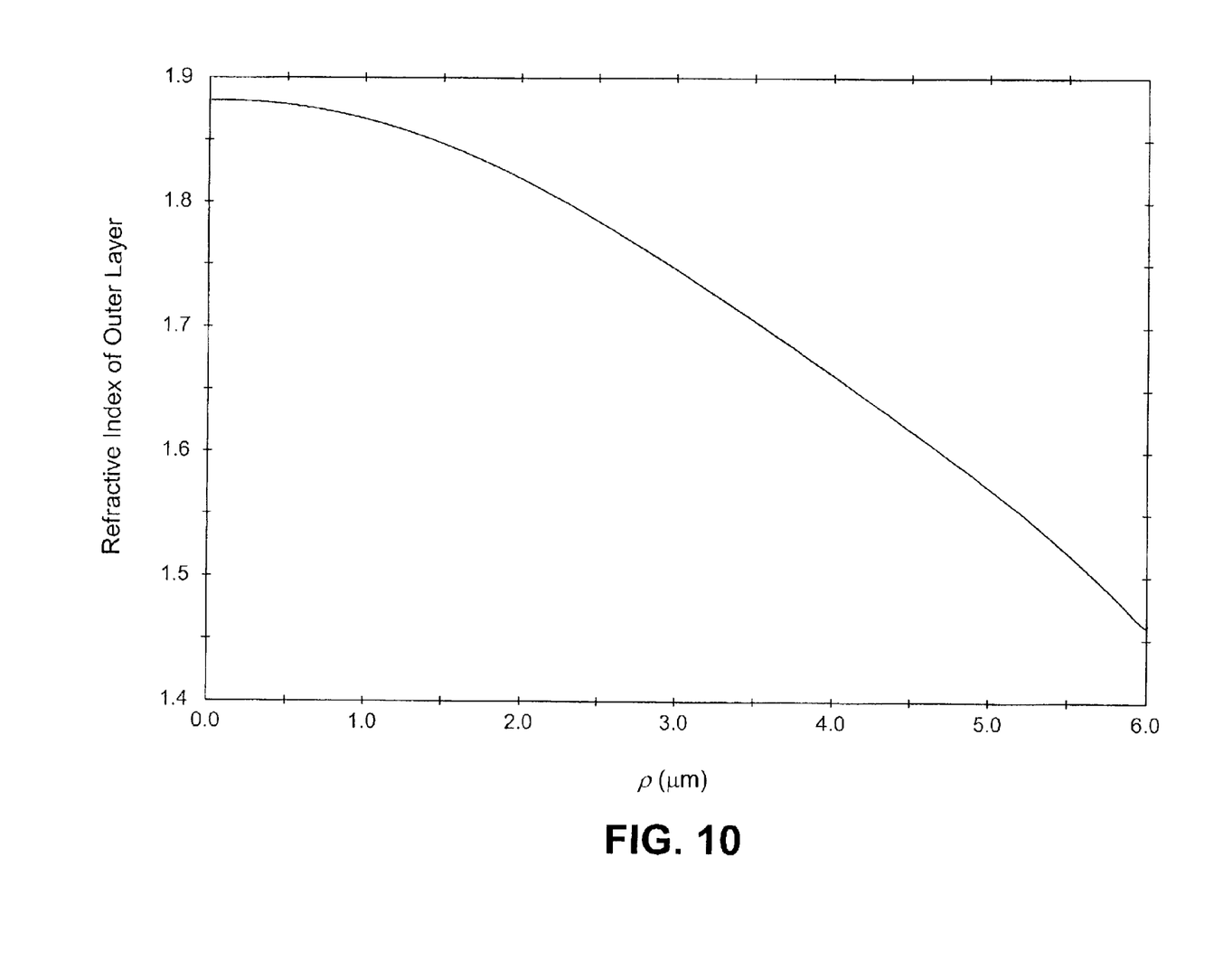
FIG. 10 is a graph plotting refractive index as a function of outer layer radius.

As the index of refraction, n, varies, so does $r_l$ such that $$r_l = \frac{1-n}{1+n} \quad \text{[Equation 10]}$$

and =−i2kl. For a concave, spherical mirror, the phase, φ, is given by $$\phi = \frac{2\pi\rho^2}{\lambda\sigma} \quad \text{[Equation 11]}$$

where σ is the radius of curvature of the mirror. By inserting various values for ρ in Equation 11, the index of refraction, n, at each value of ρ can be determined from Equations 8-10. These calculations result in the curve shown in FIG. 10. In particular, FIG. 10 is a refractive index profile for the outer layer 912. As is apparent from this figure, the refractive index of the outer layer 912 was approximated to be between 1.85 and 1.90 at the axis of symmetry 914 (i.e., ρ=0), and about 1.45 at a position 6 μm outward from the axis (i.e., ρ=6 μm).

To achieve the index profile shown in FIG. 10, the composition of the outer layer 912 can likewise be varied as a function of radius. By way of example, the composition can be varied to primarily comprise $SiC_x$ at the center of the outer layer 912 and $SiO_2$ adjacent the edges of the layer. As known in the art, $SiC_x$ has a refractive index of approximately 2.5, while $SiO_2$ has a refractive index of approximately 1.5. To fabricate such a layer of material, a layer of $SiC_x$ can first be formed through conventional material deposition techniques. Once the layer is formed, its composition can be modified through a selective oxidation process, e.g., using oxygen (excited to a plasma or ionic form) to transform portions of the $SiC_x$ into $SiO_2$. To achieve the desired radial composition variance, a selective mask structure can be used, for instance, a structure having a larger amount of mask material in the center of the composition layer that decreases radially therefrom.

Figure 11:
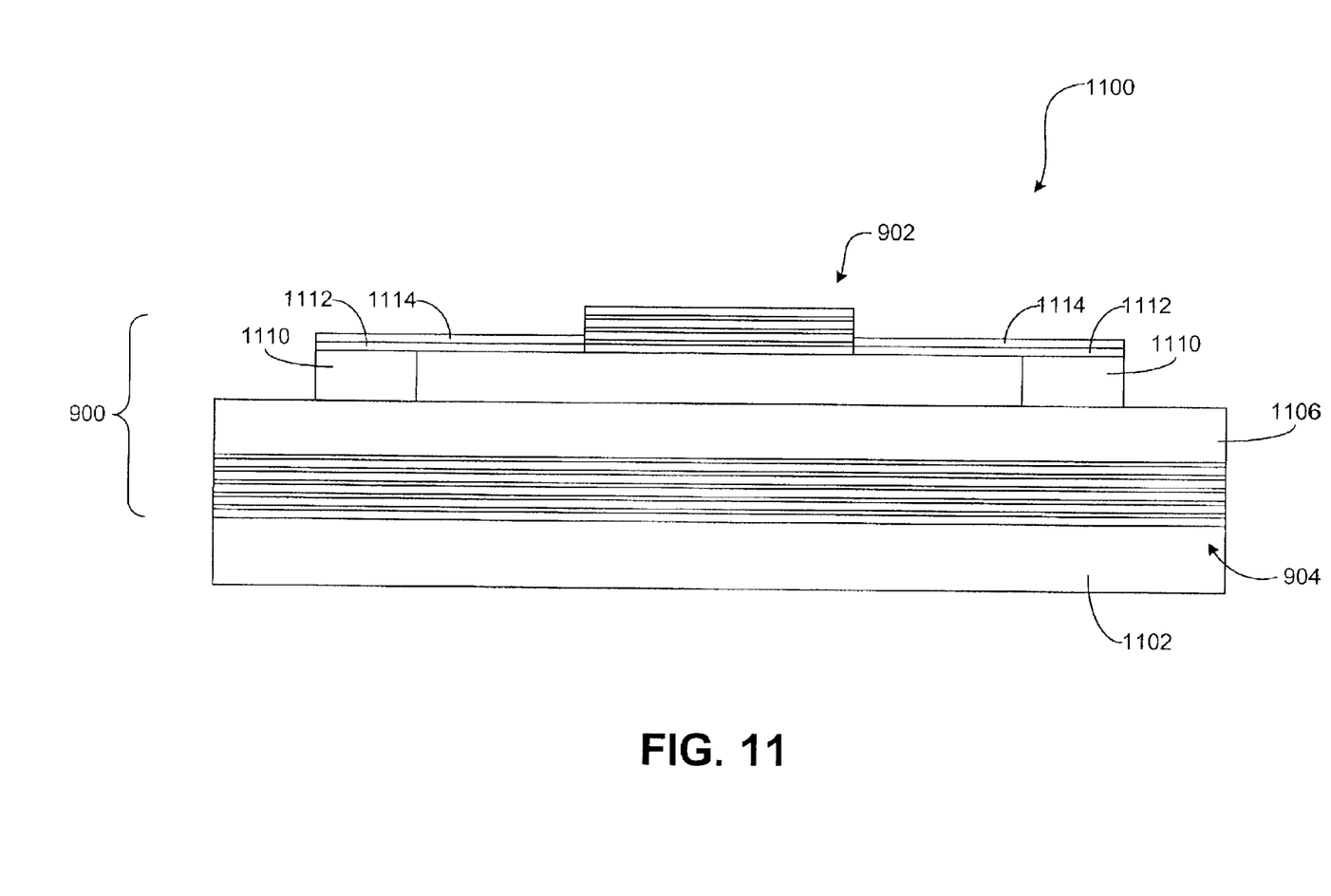
FIG. 11 is a schematic of a laser that incorporates the optical cavity shown in FIG. 9.

FIG. 11 illustrates an example laser 1100 incorporating the optical cavity 900 shown in FIG. 9. This laser is shown and described herein to provide an example application of the second optical cavity 900. Therefore, it is to be understood that the laser could have alternative construction, if desired. The laser 1100 includes a substrate 1102 that can comprise an n-type doped semiconductor material. Disposed within the optical cavity 900 is an active region 1106 that can comprise an intrinsic (i.e., undoped or lightly doped) semiconductor layer. Like the laser 700 shown in FIG. 7, the laser 1100 includes support posts 1110 and support tethers that are used to suspend the first reflector 902 above the active region 1106. Although posts 1110 and tethers are shown, it will be understood that alternative support means could be provided, if desired. Formed on the support tethers 1112 are tuning electrodes 1114 that are used to deliver voltage to the first reflector 902 and displace it downwardly toward the second reflector 904 to adjust (i.e., reduce) the length of the optical cavity 900.

Figure 12:
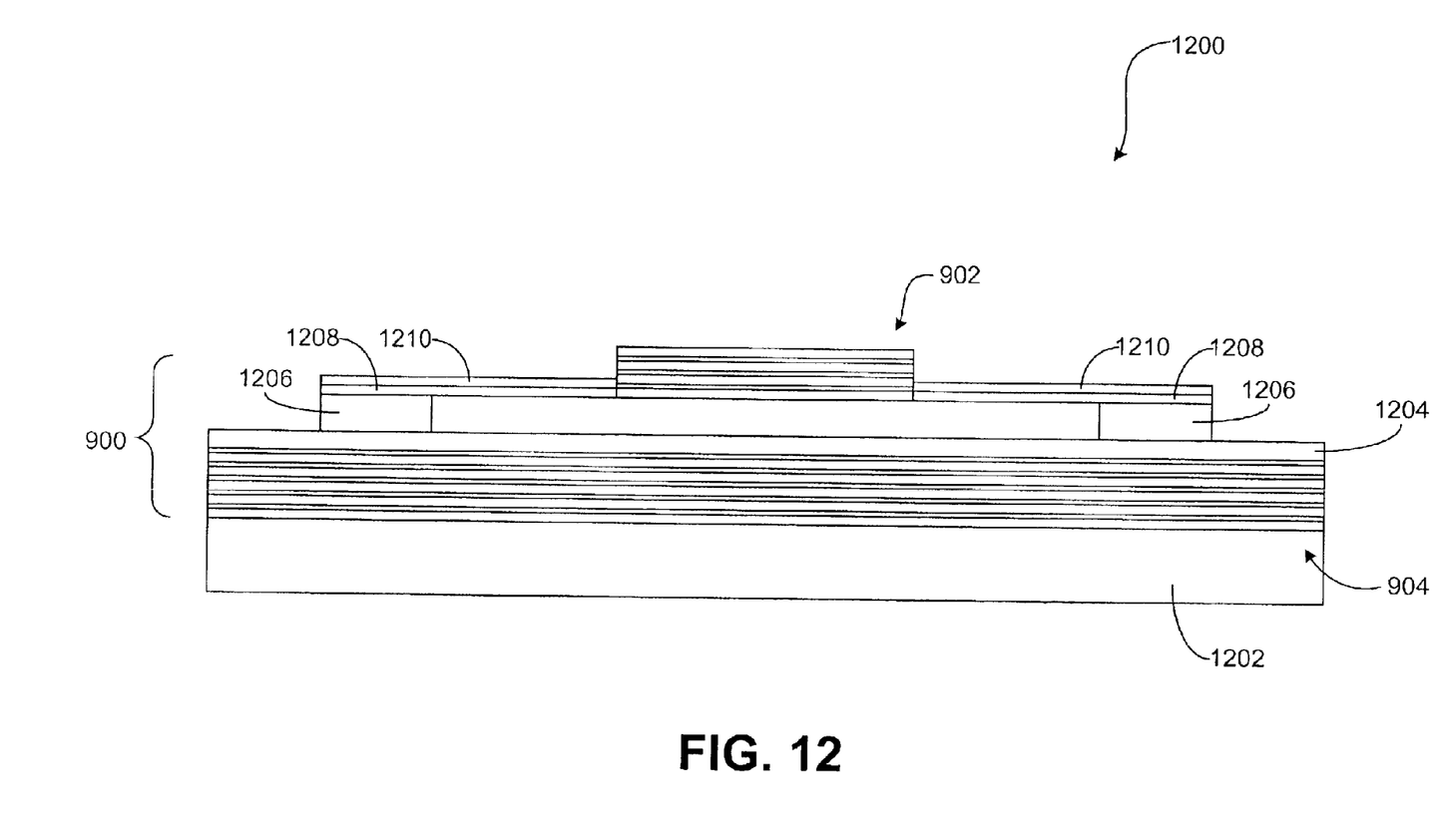
FIG. 12 is a schematic of a filter that incorporates the optical cavity shown in FIG. 9.

FIG. 12 illustrates an example filter 1200 that incorporates the optical cavity 900 shown in FIG. 9. As with the laser 1100 shown in FIG. 11, the filter 1200 is shown and described as an example application of the optical cavity 900. Therefore, it is to be appreciated that alternative constructions are feasible. As indicated in FIG. 12, the filter 1200 can include a substrate 1202, a first tuning electrode 1204, support posts 1206, support tethers 1208, and second tuning electrodes 1210. In that the filter 1200 is used to filter light as opposed to generate light, the filter 1200 does not include a gain medium such as active region 1106.

While particular embodiments of the invention have been disclosed in detail in the foregoing description and drawings for purposes of example, it will be understood by those skilled in the art that variations and modifications thereof can be made without departing from the scope of the invention as set forth in the following claims. For instance, although the focusing effect is described as being made possible by an outer layer having a varying thickness or varying refractive index, it will be appreciated that these two means of focusing can be combined in designing the optical cavity.

What is claimed is:

1. An optical cavity comprising:

a first reflector comprising:

a first layer having a planar first surface and a planar second surface, wherein the first layer has an index of refraction that varies as a function of radial distance from an axial center of the first layer; and a first reflecting stack having planar layers, wherein a planar first surface of the first reflecting stack is juxtaposed with the planar second surface of the first layer; and a second reflector comprising a second reflecting stack of planar layers, wherein the first and second reflectors are configured to provide at least one optical path from the second reflector to the first reflector such that light travelling in this optical path traverses the planar first surface of the first layer before undergoing reflection back towards the second reflector.

2. The optical cavity of claim 1, wherein adjacent layers of the first reflecting stack have different indices of refraction.

3. The optical cavity of claim 2, wherein each of the layers of the first reflecting stack has a quarter-wave optical thickness.

4. An optical cavity comprising:

a first reflector having a planar first surface and a planar second surface, wherein the planar second surface is a surface of a first layer having an index of refraction that varies as function or radial distance from an axial center of the first layer;

a second reflector having a planar first surface and a planar second surface; and a non-reflecting active region between the non-concave second surface of the first reflector and the planar first surface of the second reflector.

5. The optical cavity of claim 4, wherein the non-reflecting active region comprises a layer of semiconductor material.

6. The optical cavity of claim 4, wherein the non-reflecting active region comprises a quantum well.

* * * * *